(12) United States Patent
Yang et al.

(10) Patent No.: US 7,135,267 B2
(45) Date of Patent: Nov. 14, 2006

(54) AQUEOUS DEVELOPABLE PHOTOIMAGEABLE COMPOSITIONS FOR USE IN PHOTO-PATTERNING METHODS

(75) Inventors: Haixin Yang, Chapel Hill, NC (US); Mark Robert McKeever, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/913,874

(22) Filed: Aug. 6, 2004

(65) Prior Publication Data

US 2006/0029882 A1 Feb. 9, 2006

(51) Int. Cl.
G03F 7/038 (2006.01)
G03F 7/033 (2006.01)
G03F 7/40 (2006.01)
C08J 3/28 (2006.01)

(52) U.S. Cl. .................. 430/198; 430/260; 430/280.1; 430/281.1; 430/287.1; 430/330; 430/910; 522/71; 522/81; 522/83; 522/135; 522/136; 522/141; 522/143

(58) Field of Classification Search ............ 430/198, 430/287.1, 910, 260, 280.1, 281.1, 330; 522/71, 522/81, 83, 136, 135, 141, 143
See application file for complete search history.

(56) References Cited

U.S. PATENT DOCUMENTS

| | | | |
|---|---|---|---|
| 2,760,863 A | 8/1956 | Plambeck, Jr. | |
| 2,850,445 A | 9/1958 | Oster | |
| 2,875,047 A | 2/1959 | Oster | |
| 2,927,022 A | 3/1960 | Martin et al. | |
| 3,074,974 A | 1/1963 | Gebura | |
| 3,097,096 A | 7/1963 | Oster | |
| 3,097,097 A | 7/1963 | Oster et al. | |
| 3,145,104 A | 8/1964 | Oster et al. | |
| 3,380,831 A | 4/1968 | Cohen et al. | |
| 3,427,161 A | 2/1969 | Laridon et al. | |
| 3,479,185 A | 11/1969 | Chambers, Jr. | |
| 3,549,367 A | 12/1970 | Chang et al. | |
| 3,583,931 A | 6/1971 | Bouchard | |
| 4,162,162 A | 7/1979 | Dueber | |
| 4,912,019 A | 3/1990 | Nebe et al. | |
| 4,925,771 A | 5/1990 | Nebe et al. | |
| 5,049,480 A | 9/1991 | Nebe et al. | |
| 5,851,732 A | 12/1998 | Kanda et al. | |
| 5,858,616 A | 1/1999 | Tanaka et al. | |
| 5,972,564 A | 10/1999 | Kawana et al. | |
| 6,075,319 A | 6/2000 | Kanada | |
| 6,326,125 B1 | 12/2001 | Kakinuma et al. | |
| 6,342,322 B1 | 1/2002 | Kakinuma et al. | |
| 2003/0087170 A1* | 5/2003 | Glicksman et al. ............ 430/18 |
| 2003/0124461 A1* | 7/2003 | Suess et al. ............. 430/281.1 |
| 2003/0138708 A1* | 7/2003 | Glicksman et al. ............ 430/18 |
| 2003/0162128 A1* | 8/2003 | Song et al. ............. 430/281.1 |

FOREIGN PATENT DOCUMENTS

| | | |
|---|---|---|
| EP | 0809150 | 7/2000 |
| EP | 01008909 | 8/2003 |
| JP | 63-265979 | 11/1988 |
| JP | 5-67405 | 3/1993 |
| JP | 5-204151 | 8/1993 |
| JP | 5-206600 | 8/1993 |
| JP | 5-209139 | 8/1993 |
| JP | 5-212833 | 8/1993 |
| JP | 3-218767 | 10/2001 |

* cited by examiner

Primary Examiner—Richard L. Schilling

(57) ABSTRACT

The invention is directed to a photo-imageable composition precursor, the precursor composition comprising:
(I) finely divided particles of inorganic material comprising:
  Functional phase particles selected from electrically conductive, resistive, and dielectric particles;
  inorganic binder having a glass transition temperature in the range of from 325 to 600° C.;
dispersed in:
(II) an organic medium comprising;
  (e) aqueous developable, nonphoto-sensitive polymer which is a copolymer, interpolymer or mixture thereof, wherein each copolymer or interpolymer comprises
  (1) a nonacidic comonomer comprising a $C_{1-10}$ alkyl acrylate, $C_{1-10}$ alkyl methacrylate, styrenes, substituted styrenes or combinations thereof and
  (2) an acidic comonomer comprising ethylenically unsaturated carboxylic acid containing moiety; and
  (f) a bi-functional UV-curable monomer having a first and second functional unit, wherein the first functional unit is a vinyl group and the second functional unit is capable of forming a chemical bond by reaction with the carboxylic acid moiety.

19 Claims, No Drawings

AQUEOUS DEVELOPABLE PHOTOIMAGEABLE COMPOSITIONS FOR USE IN PHOTO-PATTERNING METHODS

FIELD OF THE INVENTION

The invention is directed to photo-imageable thick film composition(s) and tape compositions for use in photo-patterning methods. More particularly in one embodiment, photo-imageable thick film paste compositions of the present invention are used to improve performance of electrode formation in flat panel display applications, such as plasma display panels (PDPs).

BACKGROUND OF THE INVENTION

The electronics industry is continuously striving to create electronic devices which are smaller, cheaper, and provide higher resolution performance. As such, it has become necessary to develop new photo-imageable compositions and processes for photo-patterning which accomplish these goals.

Photo-patterning technologies offer uniform finer lines and space resolution when compared to traditional screen-printing methods. A photo-patterning method, such as DuPont's FODEL® photo-imageable thick film pastes, utilizes a photo-imageable organic medium as found in U.S. Pat. Nos. 4,912,019; 4,925,771, 5,049,480, 5,851,732 and 6,075,319 whereby the substrate is first completely covered (printed, sprayed, coated or laminated) with the photo-imageable thick film composition and dried, if necessary. An image of the pattern is generated by exposure of the photo-imageable thick film composition with actinic radiation through a photo-mask bearing a pattern. The exposed substrate is then developed. The unexposed portion of the pattern is washed away leaving the photo-imaged thick film composition on the substrate that is then fired to remove organic materials and sinter inorganic materials. Such a photo-patterning method demonstrates thick film line resolution of about 30 microns or larger depending on the substrate smoothness, inorganic particle size distribution, exposure and development variables. It has been proven that such a technique is useful in the manufacture of flat panel displays, such as plasma display panels.

However, the photo-imageable thick film compositions and tape compositions of the prior art typically do not incorporate photo-reactive groups in the polymer resin itself (As is the case in U.S. Pat. Nos. 4,912,019; 4,925,771, 5,049,480, 5,851,732 and 6,075,319).

U.S. Pat. No. 6,342,322 to Kakinuma et al. and JP3218767B2 to Masagi disclosed photosensitive compositions comprising specific photosensitive resins, a diluent, a photosensitive initiator, inorganic powder, and a stabilize.

Masagi discloses a photosensitive composition having an acrylic copolymer as the photosensitive resin. This again demonstrates the use of a photosensitive resin in a photosensitive composition.

The present inventors desired to provide a more economic and environmentally friendly composition(s), method of photo-patterning, and method of forming an electrode. By creating a novel composition(s) and processes, which do not require pre-formation of a photosensitive polymer in a separate process, the inventors accomplished this goal.

This invention discloses novel thick film pastes and tape compositions that generate in processing photosensitive polymers which may be photo-patterned. Unlike the prior art, the thick film paste composition of the present invention do not contain a photosensitive resin, but generate photosensitive resins during processing to form the desired photo-imaged pattern.

SUMMARY OF THE INVENTION

The invention is directed to a photo-image composition precursor, the precursor composition comprising:
  finely divided particles of inorganic material comprising:
  (a) Functional phase particles selected from electrically conductive, resistive, and dielectric particles;
  (b) inorganic binder having a glass transition temperature in the range of from 325 to 600° C.;
  dispersed in:
  an organic medium comprising;
  (c) aqueous developable, nonphotosensitive polymer which is a copolymer, interpolymer or mixture thereof, wherein each copolymer or interpolymer comprises
    (1) a nonacidic comonomer comprising a $C_{1-10}$ alkyl acrylate, $C_{1-10}$ alkyl methacrylate, styrenes, substituted styrenes or combinations thereof and
    (2) an acidic comonomer comprising ethylenically unsaturated carboxylic acid containing moiety; and
  (d) a bi-functional UV-curable monomer having a first and second functional unit, wherein the first functional unit is a vinyl group and the second functional unit is capable of forming a chemical bond by reaction with the carboxylic acid moiety.

A photo-initiation system may be added to the precursor composition to form a photo-patternable composition which may be is activated in situ.

The invention also provides a method of photo-patterning comprising the steps of:
  (a) depositing the composition of precursor composition containing a photo-initiation system onto a substrate;
  (b) initiating the reaction of the developable nonphoto-imagable polymer and the bi-functional monomer to form a photosensitive polymer and photo-patternable composition;
  (c) exposing the photo-patternable composition of (b) and substrate of (a) to actinic radiation to form an exposed part;
  (d) developing the exposed part of (b) to form a developed part; and
  (e) firing the developed part of (c) to substantially remove the organic medium and substantially sinter the inorganic material.

In this method a drying step to remove any organic solvent present in the composition may follow the deposition step (a). Also the initiation step may be accomplished at the same time as the drying step or at the same time as the as the exposure step.

The precursor composition may be a part a fully functional photo-patternable composition to make tape, film, or thick film tapes.

DETAILED DESCRIPTION

Generally, a thick film composition comprises a functional phase that imparts appropriate electrically functional properties, such as conductive, resistive, and dielectric properties. The functional phase comprises electrically functional powders dispersed in an organic medium that acts as a carrier for the functional phase. The functional phase determines the electrical properties and influences mechanical properties of a fired thick film. The thick film paste compositions and tape compositions of the present invention comprise such a functional phase along with an inorganic binder dispersed in an organic medium.

The key of the present invention is to form photosensitive or photo-crosslinkable polymers in situ during the processing of a precursor composition(s). In particular, the photosensitive or photo-crosslinkable polymers may be formed in situ during the photo-pattern formation. This is particularly useful during the photo-patterning formation of electrodes for flat panel display applications, including plasma display panels.

The general processing of photo-imageable thick film pastes, such as Fodel® products by DuPont, to form PDP electrodes includes printing or covering thick film paste (which typically contain a polymer that does not incorporate photo reactive groups) over glass substrate, drying the printed paste at about 80° C. for 20 to 40 minutes, UV-exposure, development and firing.

However, the composition of the present invention deviates from the prior art by utilizing Polymer 1, a nonphotoimagable polymer, and bi-functional monomers as identified below in the following chemical reaction forming the to initiate the reaction. For example, a strong acid generated by UV light exposure (using Uvacure® 1600 by UCB Chemicals or other suitable material) can catalyze the reaction between Polymer 1 and GMA, for example, to form Polymer 2.

A tape or sheet may be formed from the precursor composition of the present invention by drying the composition at a time and temperature sufficient to remove the organic solvent. For tape or sheet processing, the tape may be processed by various methods including, but not limited to, drying of the tape, heating of the tape in an infrared oven, heating of the tape in a thermal oven, preheating of the substrate, heating of the substrate and tape, exposure to actinic radiation, etc., as long as the tape is processed for a time and temperature or energy sufficient to initiate the reaction between the nonphotosensitive polymer and bi-functional monomer to form the photosensitive polymer.

In the case of a thick film paste composition, the same type of reaction initiation methods may be used following deposition of the paste on a substrate, but in addition in the paste composition the reaction may

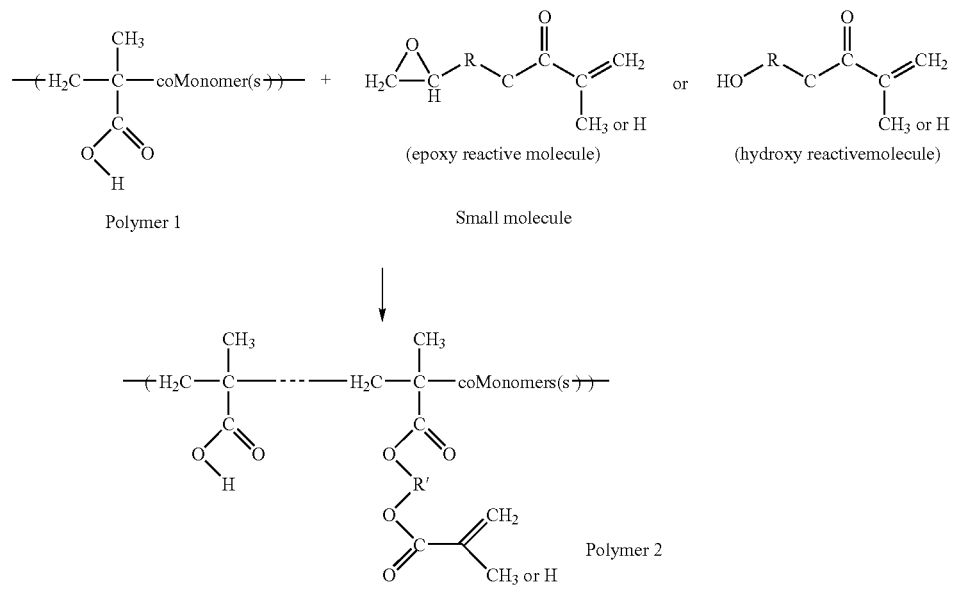

desired photosensitive polymer, Polymer 2. The reaction can take place, to a sufficient extent, during photo-pattern formation, including a drying step, or the photo-patterning step (i.e., UV-exposure), or other condition sufficient to initiate the reaction. Typically drying condition in photo-patterning processes are approximately 80° C. for approximately 20 to 40 minutes. Other conditions and even the photo-patterning step itself may initiate the chemical reaction to produce Polymer 2. Additionally, the reaction can take place under a wide range of time and temperatures, particularly with a well-selected catalyst, for example in the presence of a well-selected catalyst for conversion of an epoxy unit to an ester.

As demonstrated in Example IV (an embodiment of the present invention), the reaction of Polymer 1 and the bi-functional monomer, such as glycidyl methacrylate (GMA), can take place during photo-pattern formation. In particular, the reaction resulting in the formation of Polymer 2 may take place by processing during exposure to an energy sufficient be initiated at the same time the paste is photo-patterned.

Polymer 1 is a polymer(s) used in many photo-imageable thick film pastes compositions, as found in U.S. Pat. Nos. 4,912,019; 4,925,771, 5,049,480, 5,851,732 and U.S. Pat. No. 6,075,319, herein incorporated by reference. Polymer 1 contains methacrylic or acrylic acid and other monomer or monomers, such methacrylate. Polymer 1 is not a photosensitive polymer.

Polymer 2, which is the product of the reaction above, is a photosensitive polymer. The product of the above reaction, (i.e. Polymer 2), does not exist in the composition of this invention, but is formed during the photo-pattern formation (drying, photo-patterning, UV exposure, etc.). Only the Polymer 1 and the bi-functional bi-functional monomer 1 (an epoxy-acrylate) or bi-functional monomer 2 (hydroxyl-acrylate) exist in the composition(s) in this invention before the composition is processed. This processing may be undertaken for the purpose of formation of many articles, including electrodes in general, an electrode for flat panel display applications, such as plasma display panels (PDP). The article may be considered the PDP itself.

Composition performance can be improved by the simple addition of a bi-functional acrylate monomer, for example an epoxy—acrylate type.

The main components of the photo-imageable composition(s) of the present invention will be discussed herein below.

I. Inorganic Materials

A. Functional Phase—Electrically Functional Powders (Particles)

i. Conductor Applications

In conductor applications, the functional phase is comprised of electrically functional conductor powder(s). The electrically functional powders in a given thick film composition may comprise a single type of powder, mixtures of powders, alloys or compounds of several elements. Electrically functional conductive powders that may be used in this invention include, but are not limited to gold, silver, nickel, aluminum, palladium, molybdenum, tungsten, tantalum, tin, indium, lanthanum, gadolinium, boron, ruthenium, cobalt, tantalum, yttrium, europium, gallium, sulfur, zinc, silicon, magnesium, barium, cerium, strontium, lead, antimony, conductive carbon, platinum, copper, or mixtures thereof. The metal particles may be coated or not coated with organic materials. Virtually any shape metal powder, including spherical particles and flakes (rods, cones, and plates) may be used in practicing the invention. The preferred metal powders are gold, silver, palladium, platinum, copper or combinations thereof. It is preferred that the particles be spherical. It has been found that the dispersion of the invention must contain no significant amount of solids having a particle size of less than 0.1 μm. When the dispersions are used to make thick film pastes, which are usually applied by screen-printing, the maximum particle size must not exceed the thickness of the screen. It is preferred that at least 80 percent by weight of the conductive solids fall within the 0.5–10 μm range.

In addition, it is preferred that the surface area of the conductive particles not exceed 20 m$^2$/g, preferably not exceed 10 m$^2$/g and more preferably not exceed 5 m$^2$/g. When metal particles having a surface area greater than 20 m$^2$/g are used, the sintering characteristics of the accompanying inorganic binder are adversely affected.

ii. Resistor Applications

In resistor compositions, the functional phase is generally a conductive oxide. Examples of the functional phase in resistor compositions include Pd/Ag, RuO$_2$, pyrochlore oxides, as well as others known in the art.

Ruthenium based polynary oxides are one type of pyrochlore oxide that is a multicomponent compound of Ru$^{+4}$, Ir$^{+4}$, or their mixture (M''') represented by the following general formula

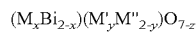

$(M_xBi_{2-x})(M'_yM''_{2-y})O_{7-z}$

M is chosen from a group consisting of yttrium, thallium, indium, cadmium, lead, copper, and rare earth materials, M' is chosen from a group consisting of platinum, titanium, chromium, rhodium, and antimony, M'' is ruthenium, iridium or their mixture, x is 0–2 but $x \leq 1$ for univalent copper, y is 0–0.5 but when M' is rhodium or is more than 1 of platinum, titanium, chromium, rhodium, or antimony, y is 0–1, and z is 0–1 but when M is bivalent lead or cadmium, this is at least equal to about x/2.

The ruthenium pyrochlore oxides are found in detail in U.S. Pat. No. 3,583,931 which is incorporated herein by reference.

Preferable ruthenium polynary oxides are bismuth ruthenate Bi$_2$Ru$_2$O$_7$, lead ruthenate Pb$_2$Ru$_2$O$_6$, Pb$_{1.5}$Bi$_{0.5}$Ru$_2$O$_{6.5}$, PbBiRu$_2$O$_{6.75}$ and GdBiRu$_2$O$_6$. These materials can easily be obtained in pure form; they are not adversely affected by glass binders and are stable even when heated to about 1000° C. in air.

The ruthenium oxides and/or ruthenium pyrochlore oxides are used in proportions of 4–50 wt %, preferred 6–30%, more preferred 5–15% and most preferred 9–12%, based on the weight of the entire composition including the organic medium.

iii. Dielectric Applications

In dielectric compositions, the functional phase is generally a glass or ceramic. Dielectric thick film compositions are non-conducting compositions or insulator compositions that separate electrical charges and may result in the storage of an electrical charge. Therefore, the thick film dielectric compositions typically contain ceramic powders, oxide and non-oxide frits, crystallization initiator or inhibitor, surfactants, colorants, organic mediums, and other components common in the art of such thick film dielectric compositions. Examples of ceramic solids include: alumina, titanates, zirconates and stannates, BaTiO$_3$, CaTi O$_3$, SrTi O$_3$, PbTi O$_3$, CaZr O$_3$, BaZr O$_3$, Ca Sn O$_3$, BaSn O$_3$, and Al$_2$ O$_3$, glass and glass-ceramic. It is also applicable to precursors of such materials, i.e., solid materials which upon firing are converted to dielectric solids, and to mixtures thereof.

B. Inorganic Binder

The function of an inorganic binder and generally a glass frit used in this invention is to bind the particles to one another and to the substrate after firing. Examples of inorganic binders include glass binders (frits), metal oxides and ceramics. Glass binders useful in the composition are conventional in the art. Some examples include borosilicate and aluminosilicate glasses. Examples further include combinations of oxides, such as: B$_2$O$_3$, SiO$_2$, Al$_2$O$_3$, CdO, CaO, BaO, ZnO, SiO$_2$, Na$_2$O, Li$_2$O, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof.

The glass frits most preferably used are the borosilicate frits, such as lead borosilicate frit, bismuth, cadmium, barium, calcium, or other alkaline earth borosilicate frits. In an embodiment, the glass binder is a Pb-free glass frit. While various Pb-free frits may be utilized, barium-bismuth based Pb-free glass frits are especially useful.

The preparation of such glass frits is well-known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

The glasses are prepared by conventional glassmaking techniques, by mixing the desired components in the desired proportions and heating the mixture to form a melt. As is well-known in the art, heating is conducted to a peak temperature and for a time such that the melt becomes entirely liquid and homogeneous. The desired glass transition temperature is in the range of 325 to 600° C.

It is preferred that at least 85% the inorganic binder particles be 0.1–10 µm. The reason for this is that smaller particles having a high surface area tend to adsorb the organic materials and thus impede clean decomposition. On the other hand, larger size particles tend to have poorer sintering characteristics. It is preferred that the weight ratio of inorganic binder to total solids be in the range 0.1 to 0.75 and more preferably in the range 0.2 to 0.5.

C. Nonphotosensitive Aqueous-Developable Polymer

The polymer binders themselves are not photosensitive. They are made of copolymer, interpolymer or mixtures thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety which is at least 10% by weight.

The presence of acidic comonomer components in the composition is important in this technique. The acidic functional group provides the ability to be developed in aqueous bases such as aqueous solutions of 0.4–2.0% sodium carbonate. If the acidic comonomers present in concentrations of less than 10%, the composition may not be washed off completely with an aqueous base. When the acidic comonomers are present at concentrations greater than 30%, the composition is less resistant under development conditions and partial development occurs in the image portions. Appropriate acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures. Because they are cleaner burning in low-oxygen atmospheres, methacrylic polymers are preferred over acrylic polymers.

The presence of acidic comonomer components also provides reaction sites for the bi-functional monomers to be linked on to polymer chains. Therefore, these acidic comonomer components allow the binder polymer to be processed by reaction into a photosensitive polymer.

If the nonacidic comonomers are alkyl acrylates or alkyl methacrylates as mentioned above, it is preferable that these nonacidic comonomers constitute at least 50 wt. %, preferably 70–85 wt. %, of the polymer binder. When the nonacidic comonomers are styrene or substituted sytrenes, it is preferable that these nonacidic comonomers constitute 50 wt. % of the polymer binder and that the other 50 wt. % is an acid anhydride such as the hemiester of maleic anhydride. A favorable substituted styrene is alpha-methylstyrene.

The nonacidic portion of the polymer binder can contain up to about 50 wt. % of other nonacidic comonomers as substitutes for the alkyl acrylate, alkyl methacrylate, styrene, or substituted styrene portions of the polymer. Examples include acrylonitrile, vinyl acetate, and acrylamide. However, because it is more difficult for these to completely burn out, it is preferable that less than about 25 wt. % of such monomers in the total polymer binder is used. The use of single copolymers or combinations of copolymers as binders are recognized as long as each of these satisfies the various standards above. In addition to the above copolymers, adding small amounts of other polymer binders is possible. For example, polyolefins such as polyethylene, polypropylene, polybutylene, polyisobutylene, and ethylene-propylene copolymers, polyvinyl alcohol polymers (PVA), polyvinyl pyrrolidone polymers(PVP), vinyl alcohol and vinyl pyrrolidone copolymers, as well as polyethers that are low alkylene oxide polymers such as polyethylene oxide may be used.

Furthermore, preferred weight average molecular weight of the polymer binder is in the range of 2,000–250,000. The molecular weight of the polymer binder will depend on the application.

The total polymer in the composition is in the range of 5–70 wt. % based on total composition and any ranges contained therein.

D. Bi-functional UV-curable Monomer

The bi-functional UV-curable monomer is a reactive molecule having a first and second functional unit, wherein the first functional unit is a vinyl group and the second functional unit is capable of forming a chemical bond by reaction with the carboxylic acid containing moiety. The two functional units in a same molecule are different. Examples of the vinyl group include, but are not limited to methacrylate and acrylate groups. Examples of the second functional unit include, but are not limited to, epoxides, alcohols and amines. In one embodiment, the first functional unit is a UV curable acrylate or methacrylate and the second functional unit is capable of forming a chemical bond by reaction with the carboxylic acid moiety of the polymer.

If the first functional unit of the bi-functional UV-curable monomer is methacrylate or acrylate, there is normally one methacrylate or acrylate unit in each bi-functional molecule. The bi-functional monomer reacts with the non-photosensitive organic binder polymer into a photosensitive binder polymer during processing of the paste composition to form an electrode, which may be used in flat panel display applications. The bi-functional monomer may present in an amount of 0.01% to 10% by weight based on the total weight of the composition. In an embodiment illustrated below, the bi-functional monomer is present in an amount of 0.05% to 2.0% by weight based on the total weight of the composition.

A catalyst may be very useful, but not necessary, for achieving high reaction yield for the described reaction. The catalysts include, but not limited to, quaternary ammonium salts, Lewis acids, tolusulfonium salts and super-acids. The amount of the catalyst, when used, may range from 0.01 % to 2% of the total composition by weight.

The following component may be incorporated into the precursor photo-imageable compositions of the present invention to provide a composition that may be processed directly to a photo-patterned article.

E. Photo-hardenable Monomer

Conventional photo-hardenable acrylate and methacrylate monomers and oligomers may be used in the invention. Monomer components may be present in amounts of 0–20 wt. %, based on the total weight of the dry photopolymerizable layer. Such preferred monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxy-phenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl)ether of bisphenol-A, di-(2-acryloxyethyl) ether of bisphenol-A, di-(3-methacrloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a weight average molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of free radical polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethlacrylate.

Additionally, urethane acrylates, methacrylates and ester acrylates may be utilized.

Besides monomers mentioned above, which are free radical polymerized, bi-, tri- tetra-functional epoxide monomers, which are cationically polymerized, are found to give rise to better performance when they co-exist with acrylate monomers and an onium salt photo-initiator. The amount of epoxide monomers may be added to the composition, but are not required. The amount of epoxide monomers that may be added ranges from 0.01% to 5% of the total composition weight.

F. Photo-initiation System

Suitable photo-initiation systems are those, which generate free radicals upon exposure to actinic light at ambient temperature. These include the substituted or unsubstituted polynuclear quinones which are compounds having two intracyclic carbon atoms in a conjugated carbocyclic ring system, e.g., 2-benzyl-2-(dimethylamino)-1-(4-morpholinophenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz (a) anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthracene-5,12-dione, and 1,2,3,4-tetra-hydrobenz(a)anthracene-7,12-dione. Other photo-initiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; alpha-hydrocarbon-substituted aromatic acyloins, including α-methylbenzoin, α-allylbenzoin and α-phenylbenzoin, thioxanthone and/or thioxanthone derivatives and the appropriate hydrogen donors. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photo-initiator or photo-initiator system is present in 0.05 to 10% by weight based on the total weight of a dry photopolymerizable layer.

G. Organic Solvent(s)

The organic solvent component of the organic medium, which may be a solvent or mixture of solvents, is chosen so as to obtain complete solution therein of the polymer and other organic components. The solvent should be inert (non-reactive) towards the other constituents of the composition. For screen printable and photo-imageable pastes, the solvent(s) should have sufficiently high volatility to enable the solvent to be evaporated from the dispersion by the application of relatively low levels of heat at atmospheric pressure, however, the solvent should not be so volatile that the paste rapidly dries on a screen, at normal room temperatures, during the printing process. The preferred solvents for use in the paste compositions should have boiling points at atmospheric pressure of less than 300° C. and preferably less than 250° C. Such solvents include aliphatic alcohols, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as Texanol® (2,2,4-trimethyl-1,3-pentanediol monoisobutyrate). For casting tapes, the solvent(s) have lower boiling points than solvents used for screen printable pastes. Such solvents include ethylacetate, methanol, isopropanol, acetone, xylene, ethanol, methylethyl ketone and toluene.

H. Other Additives

Frequently the organic medium will also contain one or more plasticizers. Such plasticizers help to assure good lamination to substrates and enhance the developability of unexposed areas of the composition. The choice of plasticizers is determined primarily by the polymer that must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly (ethylene oxides), hydroxy ethylated alkyl phenol, tricresyl phosphate triethyleneglycol diacetate and polyester plasticizers. Additional components known in the art may be present in the composition including dispersants, stabilizers, release agents, dispersing agents, stripping agents, antifoaming agents and wetting agents. A general disclosure of suitable materials is presented in U.S. Pat. No. 5,049,480.

Sample Preparation and Test Procedures

Organic Medium Preparation

The main purpose of the organic medium is to serve as a vehicle for dispersion of the finely divided solids of the composition in such form that it can readily be applied to a glass or other substrate. Thus, the organic medium must first be one in which the solids are dispersible with an adequate degree of stability. Secondly, the rheological properties of the organic medium must be such that they lend good application properties to the dispersion.

A general procedure for preparation of organic medium is as follows. The solvent and acrylic polymer were mixed and heated with stirring to 100° C. Heating and stirring was continued until the entire binder polymer had dissolved. The remaining organic components were added and the mixture was stirred at 75° C., under yellow light, until all the solids had dissolved. The solution was allowed to cool.

General Paste Preparation

Typically, thick film compositions are formulated to have a paste-like consistency, and are called "pastes". Generally, the pastes are prepared under yellow light by mixing the organic vehicle, monomer(s), and other organic components in a mixing vessel. The inorganic materials are then added to the mixture of organic components. The total composition is then mixed until the inorganic powders are wetted by the organic materials. The mixture is then roll milled using a three roll mill. The paste viscosity at this point could be adjusted with the appropriate vehicle or solvent to achieve a viscosity optimum for processing.

Care is taken to avoid dirt contamination in the process of preparing paste compositions and in preparing parts, since such contamination can lead to defects.

General Tape Preparation

The composition(s) of the present invention may be used to form a, tape, sheet, roll, or other like entity. We will discuss the entity in general terms of tape formation.

The composition of the present invention may be used in the form of a tape. If the composition is to be used in the form of a tape, a slip is prepared and used for tape casting. Slip is a general term used for the composition in tape making and is a properly dispersed mixture of inorganic powders dispersed in an organic medium. A common way of achieving a good dispersion of inorganic powders in the organic medium is by using a conventional ball-milling process. A ball milling consists of ceramic milling jar and milling media (typically spherical or cylindrical shaped alumina or zirconia pellets). The total mixture is put into the milling jar and the milling media are added. After closing the jar with a leak-tight lid, it is tumbled to create a milling action of the milling media inside the jar at a rolling speed at which the mixing efficiency is optimized. The length of the rolling is the time required to attain well-dispersed inorganic particles to meet the performance specifications. The slip may be applied to a substrate by a blade or bar coating method or other method known to those in the art, followed by ambient or heat drying. The coating thickness after drying may range from a few microns to several tens of microns depending on the application. The tape is formed by ambient or heat drying to sufficiently remove the solvents. However, the time and temperature of the drying/heating is not generally sufficient to initiate the reaction between the polymer and bi-functional monomer.

The tape may be laminated with a coversheet before it is wound as a widestock roll. Silicone coated mylar (terephthalate PET film), polypropylene, polyethylene, mylar, and nylon are examples of common coversheet material and may be used as a coversheet. The coversheet is removed before laminated to the final substrate.

Preparation of Glass Frit

The glass frit was used as available, or if necessary was prepared by water milling in a Sweco Mill using 0.5 in. diameter by 0.5 in. long alumina cylinders. The glass frit mixture was then either freeze-dried or hot air dried. Hot air drying was normally done at a temperature of 150° C. Other methods of glass frit preparation may be equally effective.

C. Printing and Laminating Conditions

The example black paste was first deposited on the glass substrate by screen-printing using a 355 mesh polyester screen. The parts were then dried at ~80° C. in an air atmosphere oven for approximately 20 minutes. The dried coating thickness was measured at 5–8 microns.

The tape was laminated by hot pressing the tape onto a glass substrate and then peeling off the coversheet.

D. Process Conditions

The parts were exposed through a phototool using a collimated UV light source with a gap of about 100 microns between the phototool and sample surface. The energy level used was between 400 and 1000 mJ/sq. cm. The exposed parts were developed using a conveyorized spray processor containing 0.5% by weight sodium carbonate in water as the developer solution. The developer solution temperature was maintained at ~30° C., and the developer solution sprayed at 10–20 psi. The developed parts were dried by blowing off the excess water, after development, with a forced air stream.

General Firing Profile

The composition(s) of the present invention may be processed by using a firing profile. Firing profiles are well within the knowledge of those skilled in the art of thick film technology. Removal of the organic medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity for the intended use or application.

In the examples, the dried parts were fired in an air atmosphere using a 3-hour profile, with a 10 min peak temperature between 520 to 580° C.

Time to Clear

The time to clear (TTC) is defined as the time in which a photo-imageable paste, coated or printed on a substrate, is completely removed by development using a conveyorized spray processor containing 0.5% by weight sodium carbonate in water, at ~30° C. with a spray pressure of 10–20 psi. TTC is determined on a test part, after the paste has been printed and dried, but before exposure to the UV light.

Line Resolution

Imaged samples were inspected using a zoom microscope at a minimum magnification of 20× with 10× oculars. The finest group of lines, which was completely intact without any, shorts (connections between the lines) or opens (complete breaks in a line), is the stated line resolution for that sample.

Dry Sample Thickness

Printed samples were dried at 80° C. for twenty minutes for Examples I through IV and dried at 82° C. for 40 minutes for Examples V and VI. The dried parts were scratched with a spatula. The thickness was measured at four different points using a contact profilometer, such as a Tencor Alpha Step 2000.

Fired Sample Thickness

Printed and dried samples were fired using a 3-hour heating profile with a 10 min. peak at 550° C. The thickness was measured at four different points using a contact profilometer.

EXAMPLES

The compositions (in weight percent of total composition) of Examples I–VIII are summarized in Table 1 below.

TABLE 4

Organic Medium III Composition used in Table 1 for Example VIII

| | |
|---|---|
| Texanol ® | 150 |
| TBAB | 2 |
| Acrylate copolymer I | 50 |
| Irgacure ® 369 | 2 |

GLOSSARY OF MATERIALS

Conductor powder I: A black conductor with formulation of Bi2Sr2CaCu2O8, made by DuPont.

TABLE 1

Sample composition for each Example (in weight percent total composition)

| | Example I | Example II | Example III | Example IV | Example V | Example VI | Example VII | Example VIII |
|---|---|---|---|---|---|---|---|---|
| Organic Medium I | 35.1 | 35.1 | 35.1 | 35.1 | | | | |
| Organic Medium II | | | | | 22.48 | | | |
| Organic Medium III | | | | | | | | 24 |
| Conductor Powder I | 17.73 | 17.53 | 17.53 | 17.53 | | | | |
| Conductor Powder II | | | | | 69.9 | | | 6 |
| Glass Frit | 40.94 | 40.94 | 40.94 | 40.94 | 2.06 | | | |
| SR-454 | 7.31 | 7.31 | 7.31 | 7.31 | 4.06 | | | |
| Malonic acid | 0.97 | 0.97 | 0.97 | 0.97 | 0.15 | | | |
| Texanol ® | 2.27 | 2.27 | 2.27 | 2.27 | 1.35 | | | |
| BHT | 0.19 | 0.19 | 0.19 | 0.19 | | | | |
| DC209 | | | | | | 99.5 | 99.5 | |
| Glycidyl Methacrylate | | | 10 | 5 | 0.5 | 0.5 | | 3 |
| TBAB | | 2 | | 1 | 0.02 | 0.02 | | |
| R0745 (I-907) | | | | | | | | |
| EBA | | | | | | | | |
| UVacure ® 1500 | | 10 | | 5 | | | 0.5 | |
| UVacure ® 1600 | | 3 | | 1 | | | 0.02 | |

The organic medium composition(s) are summarized in Tables 2, 3, and 4. A Glossary of Materials is provided following Table 4.

TABLE 2

Organic Medium I Composition used in Table 1 for Examples I through IV.

| | |
|---|---|
| Texanol ® | 62 |
| DMAc | 2 |
| Acrylate copolymer I | 30 |
| Irgacure ® 369 | 6 |
| TAOBN | 0.1 |

Note:
in weight % total organic medium composition

TABLE 3

Organic Medium Composition used in Table 1 for Examples V, VI and VII.

| | |
|---|---|
| Texanol ® | 57.36 |
| Acrylate copolymer | 36.01 |
| DETX | 3.28 |
| EDAB | 3.28 |
| TAOBN | 0.07 |

Note:
in weight % total organic medium composition

Conductor powder II: Silver powder, 7000-7 from Ferro Corporation.

Glass Frit: A glass frit, glass frit composition (in weight percent): 12.5% $B_2O_3$, 9.1% $SiO_2$, 1.4% $Al_2O_3$, 77.0% PbO, [Glass Product Number 24109 from Viox and Y-milled by DuPont].

SR-454: Trimethylolpropane ethoxy triacrylate, purchased from Sartomer.

Malnonic acid: purchased from Aldrich Chemicals. Texanol®: 2,2,4-trimethyl-1,3-pentanediol monoisobutyrate purchased from Eastman Chemicals.

BHT: 2,6-di-tert-butyl-4-methylphenol purchased from Aldrich Chemicals.

Glycidyl methacrylate: purchased from Aldrich Chemicals. UVacure® 1500: a cycloaliphatic diepoxide monomer as a free sample from UCB Chemicals.

Uvacure® 1600: phenyl-p-octyloxyphenyl-iodonium hexafluorantimonate as a free sample from UCB Chemicals.
DMAc: N,N'-dimethylacetamide, purchased from Aldrich Chemicals.

Acrylate copolymer I: A copolymer of 80%, by weight, methyl methacrylate and 20% methacrylic acid, weight average molecular weight Mw=~7,000, acid number=~125, purchased from Noveon.

Acrylate copolymer II: A copolymer of 35% methyl methacrylate, 35% ethyl acrylate, 20% butyl methacrylate and 20% methacrylic acid, weight average molecular weight=~38,000 and acid number=~129, made by Negami Chemicals in Japan.

Irgacure® 369: 2-benzyl-2-(dimethylamino)-1-(4-morpholinophenyl)-1-butanone, purchased from Ciba Specialty Chemicals.

DETX: 2,4-diethyl-9H-thioxanthen-9-one DETX speed-cure from Aceto Corporation

EDAB: Ethyl 4-dimethylaminobenzoate, Purchased from Aldrich Chemicals.

TAOBN: 1,4,4-trimethyl-2,3-diazabicyclo [3,2,2]-non-2-ene-N,N'-dioxide.

DC209: A Fodel® brand photo-patternable silver conductor thick film paste by DuPont.

Performance comparison among examples is summarized in Tables 5 and 6, below.

TABLE 5

Performance Comparison

| | Example | | | |
|---|---|---|---|---|
| | I | II | III | IV |
| Thickness (micron) | 6.6 | 7.5 | 5 | 6 |
| UV dose @ 250 mj/cm2 | | | | |
| UV dose @ 400 mj/cm2 | TWA | PWA | 30 um L/S resolution | Good quality |
| UV dose @ 800 mj/cm2 | TWA | PWA | The same | 20 um L/S resolution |
| UV dose @ 1000 mj/cm2 | TWA | PWA | The same | Good quality |
| TTC (second) | 7.8 | 12.9 | 7.1 | 7.7 |
| Development Latitude (XTTC) up to | 1.5 | 1.5 | 1.5 | 1.5 |

Notes:
TWA: totally washed away;
PWA: partially washed away.

TABLE 6

Performance Comparison

| | Example | | | |
|---|---|---|---|---|
| | V | VI | VII | VIII |
| Thickness (micron) | 9.8 | 9.6 | 9.5 | 1.3 |
| UV dose @ 250 mj/cm2 | good quality | good quality | good quality | |
| UV dose @ 400 mj/cm2 | | | good quality | |
| UV dose @ 800 mj/cm2 | 20 um L/S resolution | | 20 um L/S resolution | |
| UV dose @ 1000 mj/cm2 | | | | good quality |
| TTC (second) | 9.9 | 10 | 10.2 | 3.4 |
| Development Latitude (XTTC) up to | 1.5 | 3 | 4.5 | 1.5 |

Notes:
TWA: totally washed away;
PWA: partially washed away.

Example I shows that under the experimental condition, the original composition, i.e. in the absence of the bi-functional monomer, the printed, dried and UV-cured samples were totally washed away by development step.

Example II shows that the composition with only a molecule with diepoxide functional groups and an onium salt performed just slightly better than the original one.

Example III shows that the composition with the small bi-functional bi-functional monomer performed much better than the original one.

Example IV shows that the composition with the small bi-functional bi-functional monomer and a diepoxide molecule and an onium salt performed the best. It can even hold 20-micron lines.

Example V shows better development latitude and no thickness reduction for the developed conductor lines, compared to the composition without glycidyl methacrylate.

Example VI shows that glycidyl methacrylate was just simply mixed with a current product, DC209 by DuPont, and gave DC209 better performance, such as wider development latitude and eliminated thickness reduction for developed conductor lines, compared to DC209.

Example VII shows that addition of an epoxide monomer and an onium salt into DC209 paste made DC209 perform better, such as eliminated thickness reduction in developed conductor lines, compared to DC209 alone.

Example VIII shows that silver conductor patterns can be obtained without using photo-hardenable acrylate monomers.

What is claimed is:

1. A photo-imageable precursor composition comprising:
   finely divided particles of inorganic material comprising:
   (a) electrically functional powders selected from electrically conductive, resistive, and dielectric particles; and
   (b) inorganic binder having a glass transition temperature in the range of from 325 to 600° C.;
   dispersed in:
   an organic medium comprising;
   (c) an aqueous developable, non-photosensitive polymer which is a copolymner, interpolymer or mixture thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety; and
   (d) a bi-functional UV-curable monomer having a first and second functional unit, wherein the first functional unit is a vinyl group and the second functional unit is capable of forming a chemical bond by reaction with the carboxylic acid containing moiety, and
   (e) further comprising an epoxide monomer.

2. A photo-imageable composition comprising the precursor composition of claim 1 and a photo-initiation system.

3. The photo-imageable composition of claim 2 further comprising organic solvent and wherein the photo-imageable composition is in the form of a paste suitable for screen-printing.

4. A tape comprising the photo-imageable composition of claim 2.

5. A method of photo-patterning comprising the steps of:
   (a) depositing the composition of claim 2 onto a substrate;
   (b) initiating the reaction of the developable nonphotoimageable polymer and the bi-functional monomer to form a photosensitive polymer and photo-patternable composition;
   (c) exposing the photo-patternable composition of (b) and substrate of (a) to actinic radiation to form an exposed part;
   (d) developing the exposed part of (b) to form a developed part; and
   (e) firing the developed part of (c) to substantially remove the organic medium and substantially sinter the inorganic material.

6. The precursor composition of claim 1 further comprising an acrylic or methacrylic photo-hardenable monomer.

7. The precursor composition of claim 1 further comprising a catalyst.

8. The precursor composition of claim 1 wherein the vinyl group of the bi-functional UV-curable monomer is selected from a methacrylate, acrylate group and mixtures thereof.

9. The precursor composition of claim 1 wherein said electrically functional powders are selected from (i) Au, Ag, Pd, Pt, or Cu, (ii) $RuO_2$, (iii) ruthenium-based polynary oxides, and (v) mixtures thereof.

10. The method of claim 5 wherein following step (a) there is a drying step to remove organic solvent present in the composition.

11. The method of claim 5 wherein the initiation step (b) occurs simultaneously with step (c).

12. The method of claim 10 wherein the initiation step (b) occurs simultaneously with drying step.

13. A photo-imageable precursor composition comprising:
finely divided particles of inorganic material comprising:
(a) electrically functional powders selected from electrically conductive, resistive, and dielectric particles; and
(b) inorganic binder having a glass transition temperature in the range of from 325 to 600° C.;
dispersed in:
an organic medium comprising;
(a) an aqueous developable, non-photosensitive polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety; and
(b) a bi-functional UV-curable monomer having a first and second functional unit, wherein the first functional unit is a vinyl group and the second functional unit is capable of forming a chemical bond by reaction with the carboxylic acid containing moiety and wherein the second functional unit of the bi-functional UV-curable monomer is selected from an epoxide, amine and mixtures thereof.

14. The precursor composition of claim 13 further comprising an acrylic or methacrylic photo-hardenable monomer.

15. The precursor composition of claim 13 further comprising a catalyst.

16. The precursor composition of claim 13 wherein the vinyl group of the bi-functional UV-curable monomer is selected from a methacrylate, acrylate group and mixtures thereof.

17. The precursor composition of claim 13 wherein said electrically functional powders are selected from (i) Au, Ag, Pd, Pt, or Cu, (ii) $RuO_2$, (iii) ruthenium-based polynary oxides, and (v) mixtures thereof.

18. A photo-imageable composition comprising the precursor composition of claim 13 and a photo-initiation system.

19. The photo-imageable composition of claim 18 further comprising organic solvent and wherein the photo-imageable composition is in the form of a paste suitable for screen-printing.

* * * * *